US010969933B1

(12) United States Patent
Rouleau et al.

(10) Patent No.: US 10,969,933 B1
(45) Date of Patent: Apr. 6, 2021

(54) GRAPHICAL REPRESENTATION OF ORDERED MODEL ITEMS BASED ON SOLVER INFORMATION

(71) Applicant: The MathWorks, Inc., Natick, MA (US)

(72) Inventors: Guy Rouleau, Wayland, MA (US); Zhuohua Shen, Dover, MA (US); Fu Zhang, Sherborn, MA (US)

(73) Assignee: The MathWorks, Inc., Natick, MA (US)

( * ) Notice: Subject to any disclaimer, the term of this patent is extended or adjusted under 35 U.S.C. 154(b) by 654 days.

(21) Appl. No.: 15/426,607

(22) Filed: Feb. 7, 2017

(51) Int. Cl.
  *G06F 17/50* (2006.01)
  *G06F 3/0482* (2013.01)
  *G06F 30/18* (2020.01)

(52) U.S. Cl.
  CPC ............ *G06F 3/0482* (2013.01); *G06F 30/18* (2020.01)

(58) Field of Classification Search
  CPC .................................................... G06F 3/0482
  USPC ............................................................ 703/1
  See application file for complete search history.

(56) References Cited

U.S. PATENT DOCUMENTS

| | | | | |
|---|---|---|---|---|
| 7,178,112 B1* | 2/2007 | Ciolfi | ................. | G06F 30/3323 703/2 |
| 7,627,454 B2* | 12/2009 | LaComb | ............ | G05B 23/0229 702/182 |
| 7,664,720 B1* | 2/2010 | Freeman | ................ | G06Q 10/04 706/45 |
| 7,672,815 B2* | 3/2010 | Asgari | ................... | G06N 20/00 703/2 |
| 8,117,145 B2* | 2/2012 | Rubin | ..................... | G06F 30/00 706/46 |
| 8,326,577 B2* | 12/2012 | Graham, III | ............ | F03D 17/00 702/181 |
| 8,522,196 B1* | 8/2013 | Kim | ..................... | G06F 11/3664 717/105 |
| 8,676,551 B1* | 3/2014 | Bozin | ..................... | G06F 17/11 703/6 |

(Continued)

OTHER PUBLICATIONS

Logue et al.: Simulation of electric machinery and power electronics interfacing using Matlab/Simulink; Compel 2000. 7th Workshop on Computers in Power Electronics. Proceedings (Cat. No. 00TH8535); 2000; pp. 34-39. (Year: 2000).*

(Continued)

*Primary Examiner* — Iftekhar A Khan
(74) *Attorney, Agent, or Firm* — Cesari and McKenna, LLP; Michael R. Reinemann

(57) ABSTRACT

A device may receive data associated with executing a model. The data may be associated with a solver used during execution of the model. The device may determine a presentation order of a plurality of model items based on the data associated with executing the model. The solver may be used to determine values associated with the plurality of model items. The presentation order of the plurality of model items may be determined based on a plurality of factors. The plurality of factors may be associated with the values. The device may generate a graphical interface that indicates the presentation order of the plurality of model items. The device may provide the graphical interface. The graphical interface may provide, for display, a list of the plurality of model items. The list may be provided in association with the presentation order.

35 Claims, 12 Drawing Sheets

(56) References Cited

U.S. PATENT DOCUMENTS

| | | | | |
|---|---|---|---|---|
| 8,756,562 | B2* | 6/2014 | Ciolfi | G06F 8/34 |
| | | | | 717/105 |
| 9,026,478 | B2* | 5/2015 | Ozyurt | G06N 5/04 |
| | | | | 706/12 |
| 9,122,387 | B1* | 9/2015 | Freeman | G06F 3/0481 |
| 9,207,912 | B2* | 12/2015 | Zhang | G06F 30/20 |
| 9,454,584 | B1* | 9/2016 | Ostler | G06F 13/102 |
| 9,632,759 | B1* | 4/2017 | Yan | G06F 8/423 |
| 10,001,977 | B1* | 6/2018 | Owen | G06F 8/33 |
| 10,248,390 | B1* | 4/2019 | Venkataramani | G06F 30/34 |
| 10,353,720 | B1* | 7/2019 | Wich-Vila | G06Q 10/06395 |
| 10,719,645 | B1* | 7/2020 | Zhang | G06F 30/3323 |
| 2005/0216248 | A1* | 9/2005 | Ciolfi | G06F 30/20 |
| | | | | 703/22 |
| 2006/0064292 | A1* | 3/2006 | Clune, I | G06F 30/20 |
| | | | | 703/17 |
| 2007/0157138 | A1* | 7/2007 | Ciolfi | G06F 30/3323 |
| | | | | 716/136 |
| 2007/0157162 | A1* | 7/2007 | Ciolfi | G06F 30/20 |
| | | | | 717/105 |
| 2007/0250299 | A1* | 10/2007 | Paxson | G16B 45/00 |
| | | | | 703/11 |
| 2008/0059739 | A1* | 3/2008 | Ciolfi | G06F 30/20 |
| | | | | 711/162 |
| 2008/0141072 | A1* | 6/2008 | Kalgren | G01D 3/08 |
| | | | | 714/33 |
| 2009/0012754 | A1* | 1/2009 | Mosterman | G06F 30/20 |
| | | | | 703/2 |
| 2009/0043809 | A1* | 2/2009 | Fakhouri | G06Q 10/06 |
| 2009/0234640 | A1* | 9/2009 | Boegl | G06F 40/30 |
| | | | | 704/9 |
| 2009/0235252 | A1* | 9/2009 | Weber | G06F 9/5038 |
| | | | | 718/100 |
| 2010/0175045 | A1* | 7/2010 | Ciolfi | G06F 9/48 |
| | | | | 717/105 |
| 2011/0078652 | A1* | 3/2011 | Mani | G06F 8/10 |
| | | | | 717/105 |
| 2011/0295578 | A1* | 12/2011 | Aldrich | G06F 8/10 |
| | | | | 703/6 |
| 2011/0296435 | A1* | 12/2011 | Simsek | G06F 9/546 |
| | | | | 719/313 |
| 2012/0197750 | A1* | 8/2012 | Batra | G06Q 30/0631 |
| | | | | 705/26.7 |
| 2013/0116986 | A1* | 5/2013 | Zhang | G06F 30/20 |
| | | | | 703/2 |
| 2013/0116987 | A1* | 5/2013 | Zhang | G06F 30/20 |
| | | | | 703/2 |
| 2013/0116988 | A1* | 5/2013 | Zhang | G06F 8/40 |
| | | | | 703/2 |
| 2013/0116989 | A1* | 5/2013 | Zhang | G06F 8/10 |
| | | | | 703/2 |
| 2013/0198713 | A1* | 8/2013 | Zhang | G06F 17/13 |
| | | | | 717/106 |
| 2013/0326472 | A1* | 12/2013 | Han | G06F 8/10 |
| | | | | 717/105 |
| 2014/0068410 | A1* | 3/2014 | Dolinina | G06F 11/3684 |
| | | | | 715/234 |
| 2014/0359569 | A1* | 12/2014 | Avadhanula | G06F 8/35 |
| | | | | 717/109 |
| 2015/0095878 | A1 | 4/2015 | Zhang et al. | |
| 2015/0379429 | A1* | 12/2015 | Lee | G09B 5/00 |
| | | | | 706/11 |
| 2016/0018962 | A1* | 1/2016 | Low | G06F 3/0481 |
| | | | | 715/771 |
| 2016/0357895 | A1* | 12/2016 | Hyde | G06F 30/20 |
| 2017/0351492 | A1* | 12/2017 | Szpak | G06F 30/367 |

OTHER PUBLICATIONS

Logue et al. ("Simulation of Electric Machinery and Power Electronics Interfacing Using Matlab/Simulink", IEEE, 34-39) (Year: 2000).*

Zhang et al. ("An Effective Interaction Control Mechanism with Minor Step for Multidisciplinary Collaborative Simulation System", IEEE, 2010) (Year: 2010).*

Ovcharuk, et al. ("Evaluating the Effectiveness of Graphical Programming Packages for Solving Problems of Identification of Acoustic Signals",IEEE, pp. 1-4) (Year: 2013).*

"Simulink®: User's Guide," R2016b, The MathWorks, Inc., Sep. 2016, pp. 1-4022.

* cited by examiner

FIG. 1C

TCE 102

File  Edit  Tools  View  Execute

Solver  Plot  Model Items

| Statistics | Suggestions | Zero Crossing | Solver Exceptions |

MODEL INFORMATION
| | |
|---|---|
| Blocks with states | 24 |
| States | 24 |
| Start time | 0 |
| Stop time | 30 |
| Absolute tolerance | 1.00e-03 |
| Relative tolerance | 1.00e-03 |

STEP INFORMATION
| | |
|---|---|
| Max step size | 1 |
| Min step size | 3.55e-15 |
| Average step size | 2.36e-04 |
| Max step size usage(%) | 0 |
| Total steps | 127,208 |

EVENT INFORMATION
| | |
|---|---|
| Zero crossing source | 25 |
| Zero crossing source triggered | 14 |
| Total zero crossing | 3978 |
| Total solver reset | 3912 |
| Total solver exception | 10574 |
| Error control exception | 9261 |
| Newton iteration exception | 1299 |
| Infinite state exception | 0 |
| DAE newton iteration exception | 0 |

| Number | State |
|---|---|
| 3863 | spl_show_DAE_failure2/4-Way Directional Valve |
| 98 | spl_show_DAE_failure2/Check Valve |
| 14 | spl_show_DAE_failure2/Double-Acting Hydraulic Cylinder |
| 1 | |

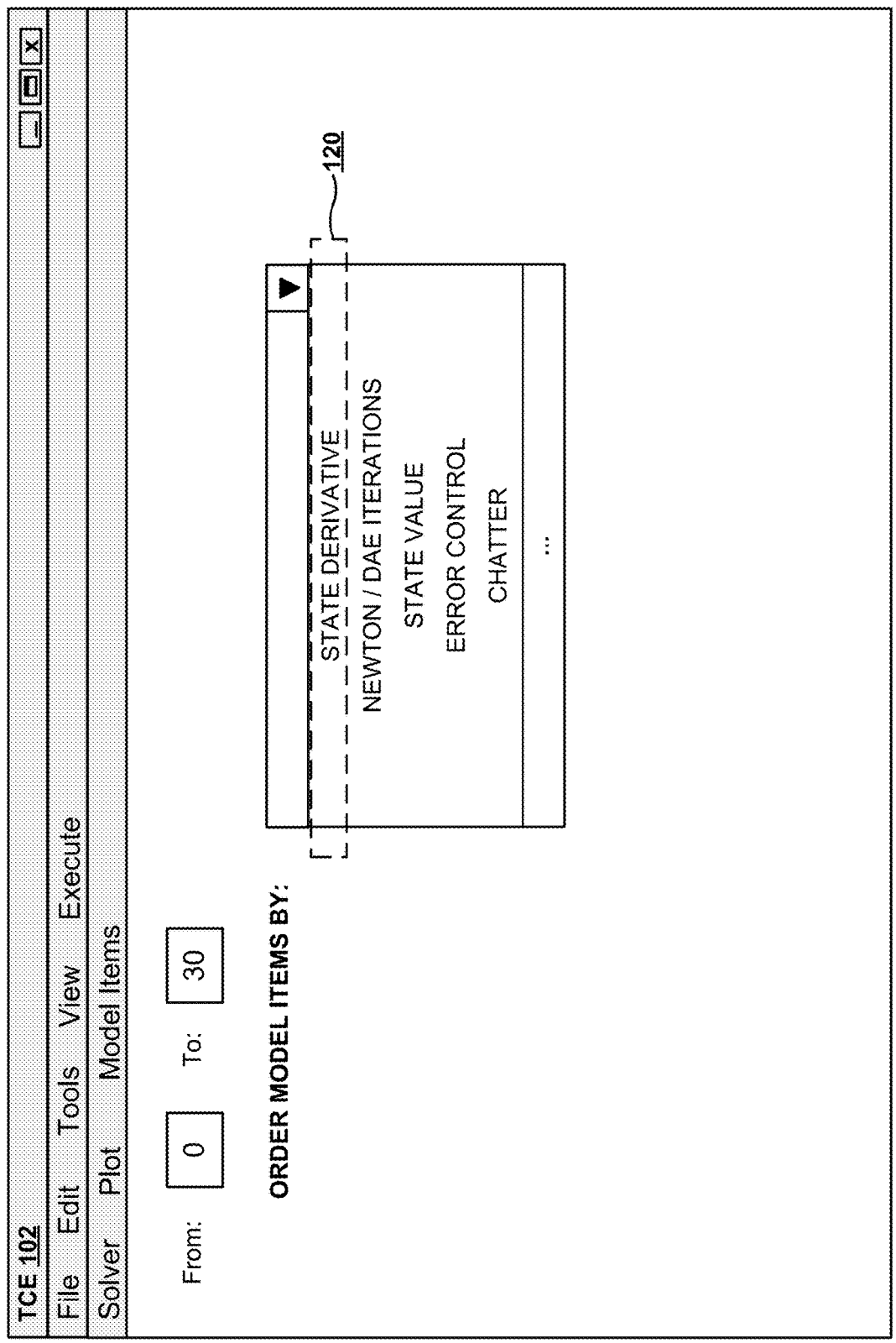

GRAPHICAL REPRESENTATION OF ORDERED MODEL ITEMS BASED ON SOLVER INFORMATION

BRIEF DESCRIPTION OF THE DRAWINGS

FIGS. 1A-1I are diagrams of an overview of an example implementation described herein;

DETAILED DESCRIPTION

Figure 1A:
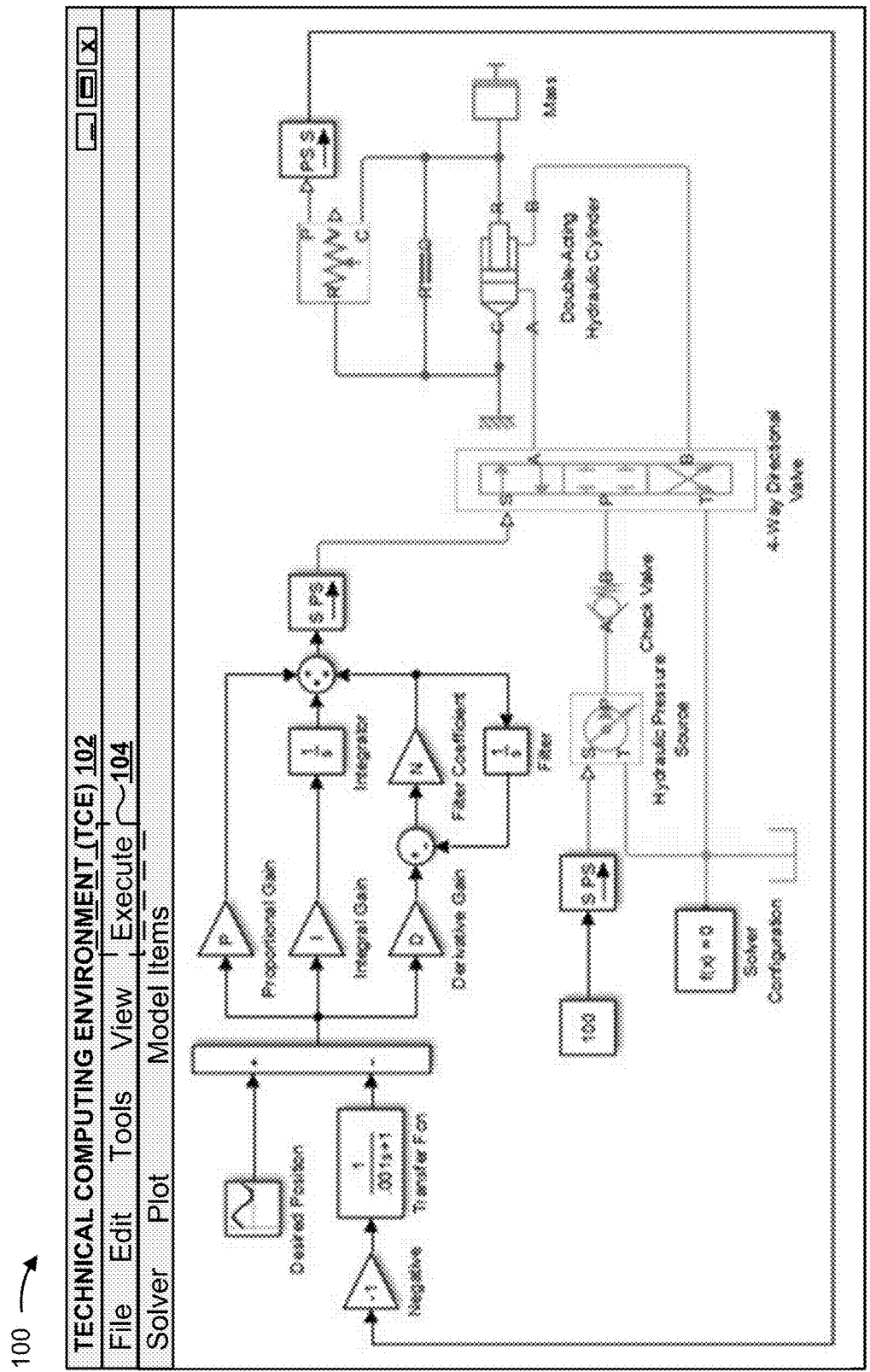

The following detailed description of example implementations refers to the accompanying drawings. The same reference numbers in different drawings may identify the same or similar elements.

A graphical modeling environment may include a set of various elements (e.g., blocks in a block diagram model) that, when executed by a computing device, simulates behavior of a system, such as a dynamic system, a natural system, a physical system, or the like. A user may configure a model, for example, by specifying a block arrangement, specifying configuration parameters associated with the model, or the like, and may cause a computing device to perform a simulation (e.g., execute the model that simulates the system). In some cases, the simulation may not perform as expected. For example, the simulation may not accurately simulate the intended physics, may not run efficiently (e.g., may perform additional steps, and/or may unnecessarily reduce a step size), may simulate longer than expected, may be associated with an error (e.g., a stall), or the like. The user may be required to determine whether the model operates correctly and/or efficiently, determine whether the model needs to be debugged, determine whether the model is to be modified to increase execution speed, determine a particular element that is causing an event to occur, or the like. However, in some cases, a model may include multiple systems, multiple sub-systems, a large quantity of blocks, and/or a large quantity of states. As such, the user may have difficulty identifying a cause, or causes, of issues associated with the model (e.g., may be required to spend an excessive amount of time debugging the model).

Implementations described herein enable a computing device to collect data based on executing a model, and determine, based on the collected data, particular model items that are associated with events that may cause the simulation to perform unexpectedly. Additionally, implementations described herein enable the computing device to determine a presentation order of model items based on the events, and to provide a graphical interface, that identifies the ordered model items, for display in the presentation order. In this way, implementations described herein assist a user in identifying particular model items (e.g., states, blocks, and/or the like) that may cause the simulation to perform in a non-optimal and/or unexpected manner (e.g., an inefficient manner, an incorrect manner, etc.). Additionally, implementations described herein enable a computing device to identify particular portions of a model (e.g., a block, a set of blocks, etc.) that may be causing the simulation to perform unexpectedly, and to provide the particular portions for display.

In this way, implementations described herein reduce a quantity of time required for debugging and/or troubleshooting purposes. The implementations described herein may assist a user in identifying diagnostics (e.g., errors, warnings, etc.) associated with the execution of graphical models and/or may reduce a quantity of computing resources required to debug a model (e.g., by enabling a user to more quickly identify a source of an error, by providing suggestions regarding errors, or the like), thereby conserving computing resources, such as processing power, memory, or the like, and reducing programming time.

FIG. 1A-1I are diagrams of an overview of an example implementation 100 described herein. In the examples shown in FIGS. 1A-1I, the programming environment is a technical computing environment (TCE) 102 executing on a device. In some implementations, TCE 102 may receive information that identifies a model. For example, TCE 102 may receive information that identifies a model based on an input from a user and/or from another device. In some implementations, a user may interact with TCE 102 to create, modify, and/or load a model. As described in more detail in association with FIG. 2, a model may include, for example, a block diagram model, a mathematical model, a textual model, a set of equations (e.g., causal equations, non-causal equations, etc.), a flow chart, and/or program code that describes the model.

As shown in FIG. 1A, TCE 102 may receive information that identifies a model that simulates a pressure source that may be directed towards a double-acting hydraulic cylinder. In some implementations, TCE 102 may execute the model. For example, TCE 102 may execute the model based on executing program code associated with the model. In some implementations, TCE 102 may execute the model based on user input, received via the device that is executing TCE 102, indicating that the device is to execute the model. For example, as shown in FIG. 1A, and by reference number 104, a user may interact with TCE 102, and TCE 102 may execute the model based on the interaction.

In some implementations, TCE 102 may execute the model based on a configuration parameter associated with a solver. A solver may include a program that applies a numerical method to solve equations (e.g., ordinary differential equations (ODEs), differential and algebraic equations (DAEs), or the like) that represent the model. In some implementations, a solver may determine a value associated with a state at a particular time interval (e.g., a time step). A step size may refer to a value associated with the particular time interval. Additionally, a model may include one or more states. For example, a state may include a variable that determines an output value associated with a block. In some implementations, a state may include a value that is a function of a previous value associated with a block and/or an initial value associated with a block. Additionally, or alternatively, a state may include one or more sub-states (e.g., may be a compound state). In some implementations, values associated with a state may affect a step size associated with a solver (e.g., may cause the solver to reduce a step size, increase a step size, etc.).

In some implementations, the configuration parameter may identify a type of solver (e.g., variable-step, fixed step, discrete, continuous, implicit, explicit, zero crossing, algebraic loop, etc.), a step size value (e.g., a maximum step size, a minimum step size, an initial step size, etc.), a tolerance value (e.g., a relative tolerance value, an absolute tolerance value, etc.), or the like. Additionally, or alternatively, a configuration parameter may identify a maximum order value, a solver reset method, a quantity of consecutive minimum step size violations that may be allowed during execution, a zero crossing detection method, a quantity of consecutive zero crossings that may occur during execution, a signal threshold (e.g., used during zero crossing detection), a quantity of Newton iterations that may be used to determine values associated with states, or the like.

In some implementations, TCE 102 may receive data associated with executing the model based on executing the model. For example, TCE 102 may collect data (e.g., stored in a data structure), associated with executing the model, while TCE 102 executes the model. The data structure may be stored local to or remote from the device that is executing TCE 102. In some implementations, the data associated with executing the model may include information associated with a solver. For example, TCE 102 may receive data that identifies a quantity of blocks, a quantity of states, a start time associated with the simulation, a stop time associated with the simulation, a quantity of steps, a step size value (e.g., maximum, minimum, average, etc.), a maximum step size utilization value (e.g., a percentage of steps that included the maximum step size), or the like.

In some implementations, TCE 102 may receive data associated with an event that occurs during execution of the model. In some implementations, an event may include a zero crossing, such as when a state is associated with a discontinuity (e.g., when a signal associated with a state satisfies a signal threshold). Additionally, or alternatively, an event may include a solver reset (e.g., an event where a solver resets one or more parameters and/or states). Additionally, or alternatively, an event may include a solver exception, such as an error control exception (e.g., a tolerance-exceeding event where an estimated error value associated with a determined state value satisfies a threshold error value), a Newton iteration failure (e.g., where Newton iterations fail to converge), an infinite state exception (e.g., where a value associated with a state becomes infinite), a differential algebraic equation (DAE) Newton iteration failure (e.g., where DAE Newton iterations fails to converge), a Newton iteration tolerance failure (e.g., where an amount of performed Newton iterations satisfies a threshold (e.g., a user-defined threshold, a system-specified threshold, etc.) or the like.

In some implementations, TCE 102 may provide, for display, information that identifies a warning. For example, a warning may be indicative of an event, may be indicative that an event may occur (e.g., is likely to occur), or the like. In this way, a user may view information associated with a warning, and implement corrective action, thereby conserving processor and/or memory resources of the device that is executing the model.

In some implementations, TCE 102 may determine a presentation order of model items based on the data associated with executing the model. A presentation order of model items may include a manner in which information identifying the model items is to be provided for display (e.g., ordered model items presented in a list, a hierarchy, or the like). In some implementations, a model item may include a state, a block, a variable, a trace, an equation, or the like. In some implementations, a trace may include a set of values associated with another model item (e.g., a block, a port, a signal, a state, a variable, etc.). In some implementations, the presentation order may include a list of model items, and may enable a user to identify particular issues with the simulation. For example, the presentation order of model items may enable a user to identify particular model items that may cause the simulation to run inefficiently (e.g., may cause a solver to perform additional steps, may cause a solver to reduce a step size, may cause a solver to generate an error, or the like). In this way, a user may interact with the list of model items (e.g., select particular model items, or the like) to identify additional information associated with a particular model item, a set of model items, etc.

In some implementations, TCE 102 may determine a presentation order of model items based on one or more factors. In some implementations, a factor may include a quantity of events (e.g., a quantity of zero crossing events, a quantity of solver resets, a quantity of solver exceptions, a quantity of warnings, or the like). For example, TCE 102 may determine a presentation order of model items based on a quantity of events associated with each model item, a quantity of a particular event associated with each model item, or the like. For example, TCE 102 may determine a presentation order of model items that indicates that model items that are associated with more events (e.g., a greater quantity of events, a greater quantity of a particular event, or the like) are to be presented before model items that are associated with fewer events (e.g., presented higher in a list than as compared to model items that are associated with a reduced quantity of events, presented instead of model items that are associated with a reduced quantity of events, or the like).

Additionally, or alternatively, a factor may include a value associated with a model item (e.g., where the model item is a state, the factor may include a value of a state, a derivative value of a state, a range of values associated with a state, high frequency oscillations of values around a discontinuity (e.g., chatter), or the like). For example, TCE 102 may determine a presentation order of model items that indicates that model items that are associated with particular values (e.g., greater values, values that are fluctuating the most, values that are fluctuating more quickly, or the like) are to be provided for display before model items that include other values (e.g., smaller values, values that are not fluctuating as quickly, etc.). In some implementations, TCE 102 may determine a presentation order of model items based on values of the model items. For example, TCE 102 may identify a model item that includes the greatest value (e.g., greatest value, highest derivative, greatest in value, etc.) and may rank the model item higher than another model item that includes a lower value or values.

Additionally, or alternatively, a factor may include a name of a model item. For example, TCE 102 may determine a presentation order of model items based on names associated with the model items (e.g., may order the states in alphabetic order, or the like). Additionally, or alternatively, a factor may include a user defined factor (e.g., a user may input program code to define a factor). For example, TCE 102 may receive information that identifies a user defined factor, and may determine a presentation order of model items based on the user defined factor. Additionally, or alternatively, a factor may include a location. For example, if the model item is a block, then the factor may include a location of a block (e.g., where in the model the block is located, a quantity of other blocks that are affected by the block, etc.). For example, TCE 102 may determine a presentation order of model items that indicates that model items that affect more blocks are to be presented for display before model items that affect less blocks, or the like.

In some implementations, TCE 102 may determine a presentation order of a particular model item (e.g., a block) based on another model item (e.g., a state, a set of states, etc.) that is associated with the particular model item. For example, TCE 102 may determine an amount of states associated with each block, values of the states associated with each block, or the like. In some implementations, TCE 102 may determine a presentation order of the particular model items (e.g., blocks) based on the respective amounts of states associated with each block (e.g., rank a block that includes the most amount of states higher than a block that includes less states). Additionally, or alternatively, TCE 102 may determine a presentation order of the blocks based on values, of states, associated with the respective blocks. For example, TCE 102 may rank a block, that includes the state with the highest value (e.g., highest value, most fluctuation, quickest fluctuation, etc.) higher than as compared to another block that includes a state with a lower value. Additionally, or alternatively, TCE 102 may determine an average value of states for a particular block, and rank the block based on the average value. For example, assume that a first block includes a state with a highest value (e.g., as compared to other states of the model) and a relatively low value. Additionally, assume that a second block includes multiple states with relatively high values. In this case, TCE 102 may rank the second block higher than the first block (e.g., based on an average value of states of the second block being greater than an average value of states of the first block). Alternatively, TCE 102 may rank the first block higher than the second block (e.g., based on the first block being associated with the state that includes the highest value).

In some implementations, TCE 102 may assign a weight value to a factor, and may determine an overall value (e.g., a score, such that the model items may be ranked) for a model item based on a combination of factors. For example, TCE 102 may determine a presentation order of model items based on a combination of particular factors (e.g., based on overall values associated with the model items). Alternatively, TCE 102 may determine a presentation order of model items based on a single factor. As an example, TCE 102 may filter a list of model items based on a factor, and may determine a presentation order based on filtering the list of model items. In this way, a user may interact with TCE 102 to identify particular model items that are associated with particular factors, particular combinations of factors, etc., as described in more detail elsewhere herein.

In some implementations, TCE 102 may determine a presentation order of model items based on a time frame. In some implementations, TCE 102 may determine a presentation order of model items at run time (e.g., TCE 102 may process the data while the model executes, and the presentation order of model items may change as the model executes). Alternatively, TCE 102 may determine the presentation order of model items based on executing the model (e.g., TCE 102 may perform post-processing of the data when the model has finished executing). In some implementations, TCE 102 may determine a presentation order of model items based on a user input that identifies a time frame. For example, a user may input a first value and a second value to identify a time frame, and TCE 102 may determine the presentation order of model items based on data associated with the first value and the second value (e.g., associated with the model execution between the first value and the second value).

In some implementations, TCE 102 may determine a presentation order of model items based on a time frame, and may continue to execute the model (e.g., for a period of time that is greater than the time frame). For example, assume that TCE 102 is executing the model and/or is determining a presentation order of model items based on executing the model. In this case, a user may interact with TCE 102 to prevent TCE 102 from continuing to determine the presentation order of model items (e.g., to prevent TCE 102 from determining the presentation order of model items using data collected beyond the time of interaction, such as when the user interacts with TCE 102). In this way, TCE 102 may conserve computing resources.

Additionally, TCE 102 may continue to execute the model and may continue to collect data associated with the model (e.g., may store the collected data, and may not use the collected data when determining the presentation order of model items). Additionally, the user may interact with TCE 102 to allow TCE 102 to determine a presentation order of model items using data collected beyond the time of interaction.

In some implementations, TCE 102 may determine a presentation order of model items based on a selection of a particular portion of the model. For example, TCE 102 may receive input that identifies one or more model items included in the model (e.g., a particular block, a particular set of blocks, a particular region encompassing one or more blocks included in the model, a particular system associated with the model, a particular sub-system associated with the model, a particular set of states, etc.), and TCE 102 may determine a presentation order of model items based on the received input. For example, TCE 102 may determine model items that are associated with the selected portion of the model, and may determine the presentation order of model items based on the determined model items. In this way, a user may interact with TCE 102 to identify a particular model item (e.g., block, or set of blocks), and TCE 102 may determine a presentation order of model items based on the model items (e.g., based on states that are associated with the identified block or blocks, or the like).

In some implementations, TCE 102 may generate a graphical interface based on the presentation order of model items. For example, TCE 102 may generate a graphical interface based on determining a presentation order of model items. In some implementations, TCE 102 may generate a graphical interface when TCE 102 executes the model and/or determines the presentation order of model items. Additionally, or alternatively, TCE 102 may generate the graphical interface based on receiving (e.g., via user input, via another device, etc.) information indicating that TCE 102 is to generate the graphical interface.

In some implementations, the graphical interface may include a visual representation of the presentation order of model items and/or data associated with executing the model. In some implementations, TCE 102 may provide an input mechanism that permits a user to interact with a factor (e.g., a drop-down menu, a list, a menu, a text box, a check box, a button, a slider, or the like). Additionally, TCE 102 may determine a presentation order of model items based on a selected factor or factors, and may provide information that identifies the presentation order of model items for display (e.g., may provide information that identifies the states, in association with the presentation order, via the graphical interface). In some implementations, TCE 102 may provide information that includes an entire list of model items for display (e.g., each state associated with the model, each block associated with the model, or the like). For example, TCE 102 may determine a presentation order of model items, and may provide information that identifies each model item for display (e.g., in a graphical and/or textual format and/or in association with the presentation order). Alternatively, TCE 102 may provide information that identifies a subset of model items for display. For example, TCE 102 may identify a particular quantity of model items (e.g., the top ten in the presentation order, the top five in the presentation order, etc.), particular model items that include factor values that satisfy a threshold, etc., and may provide information that identifies the particular model items for display.

In some implementations, TCE 102 may provide the graphical interface. For example, a device that is executing TCE 102 may provide the graphical interface for display. In some implementations, TCE 102 may provide the graphical interface when TCE 102 generates the graphical interface. Additionally, or alternatively, TCE 102 may provide the graphical interface based on receiving information identifying a user input that indicates that the graphical interface is to be provided.

Figure 1B:
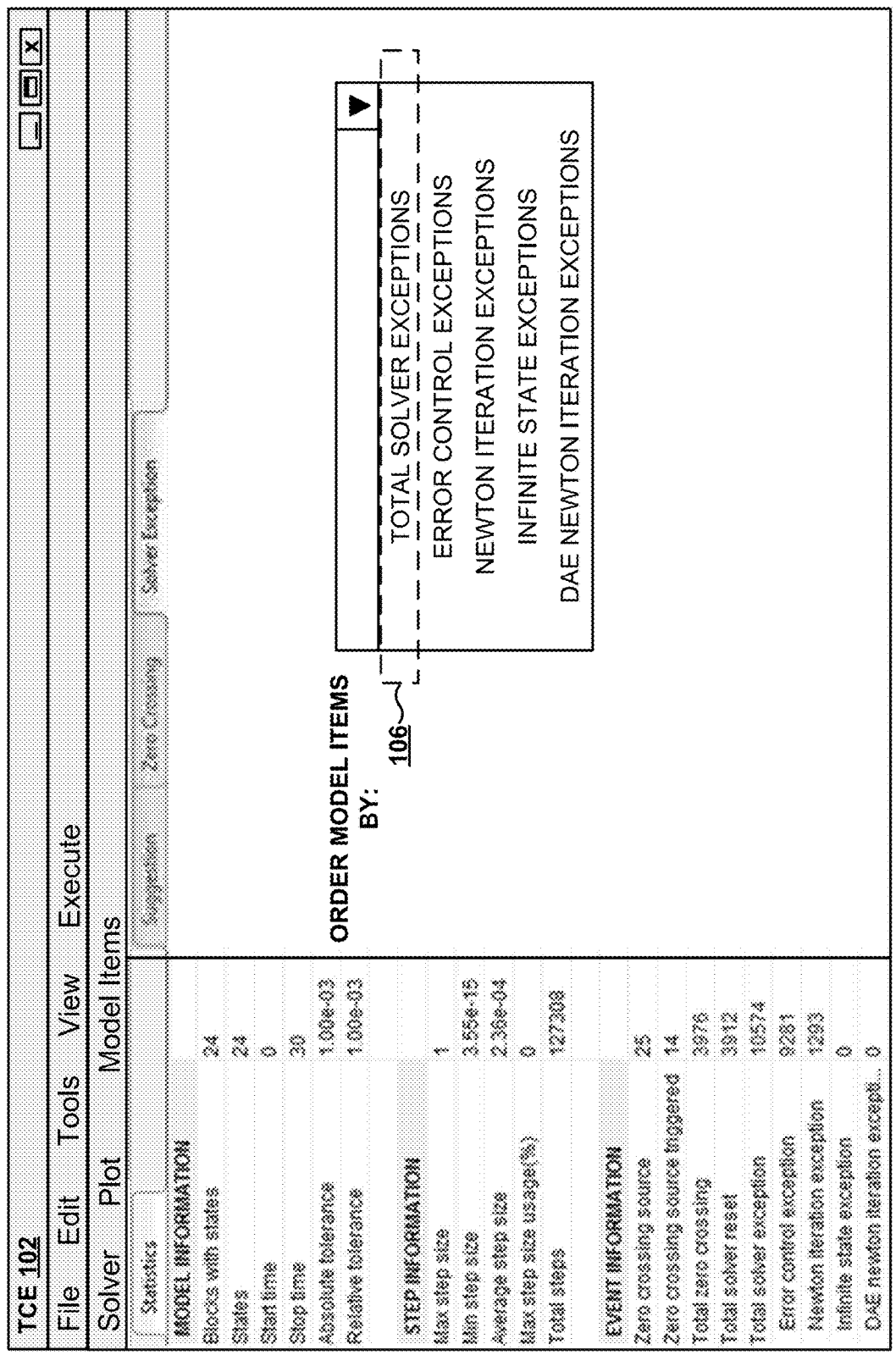

For example, as shown in FIG. 1B, TCE 102 may provide a graphical interface that identifies information associated with executing the model (e.g., a quantity of blocks, a quantity of states, a start time, a stop time, an absolute tolerance value, a relative tolerance value, etc.). Additionally, as shown, the graphical interface may identify information associated with a solver (e.g., a maximum step size value, a minimum step size value, an average step size value, a maximum step size utilization value, a quantity of steps, etc.). Additionally, as shown, the graphical interface may display information associated with an event (e.g., a quantity of zero crossings, a quantity of solver resets, a quantity of solver exceptions, etc.).

As further shown in FIG. 1B, the graphical interface may display information associated with a solver exception. For example, as shown, TCE 102 may provide an input mechanism (e.g., a drop-down menu) that may enable a user to select one or more solver exceptions (e.g., "total solver exceptions," "error control exceptions," "Newton iteration exceptions," "infinite state exceptions," and "DAE Newton iteration exceptions"). As shown by reference number 106, assume that a user selects "total solver exceptions." In this case, TCE 102 may determine a presentation order of the model items based on a total quantity of solver exceptions associated with each particular model item, and may provide information that identifies the presentation order for display.

Figure 1C:
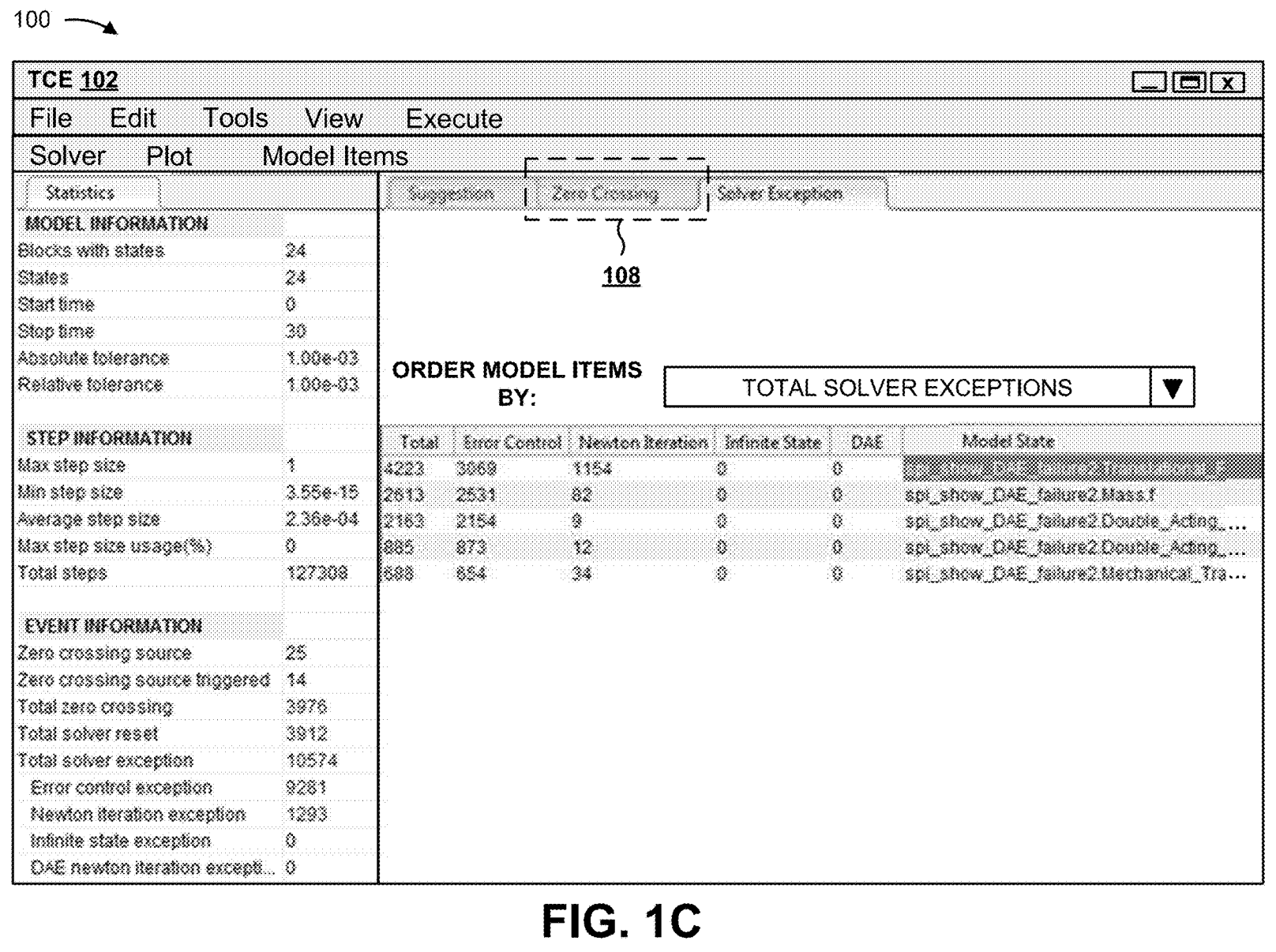

As shown in FIG. 1C, the graphical interface may provide, for display, a list of ordered model items (e.g., states) based on a total quantity of solver exceptions associated with each state (e.g., in association with a particular presentation order). As shown, a particular state (e.g., "spi_show_DAE_failure2.Translational_Friction.f"), associated with a particular block (e.g., a "translational friction" block) includes a particular quantity of solver exceptions (e.g., "4223"). Additionally, as shown, TCE 102 may display a quantity of other solver exceptions associated with "spi_show_DAE_failure2.Translational_Friction.f," and a quantity of total solver exceptions and other solver exceptions associated with other states. As further shown in FIG. 1C, and by reference number 108, assume that a user interacts with TCE 102 and selects a "Zero Crossing" tab.

As shown in FIG. 1D, based on the user interaction, the graphical interface may display information associated with zero crossing events. For example, as shown, TCE 102 may determine a presentation order of states based on a quantity of zero crossing events associated with each state, and may provide a list of ordered states for display in association with the presentation order. As shown, the state "spi_show_DAE_failure2.Translational_Friction.f" may be associated with a particular quantity of zero crossing events (e.g., "3863"). As further shown in FIG. 1D, and by reference number 110, assume that a user interacts with TCE 102 and selects a "Suggestion" tab.

Figure 1E:
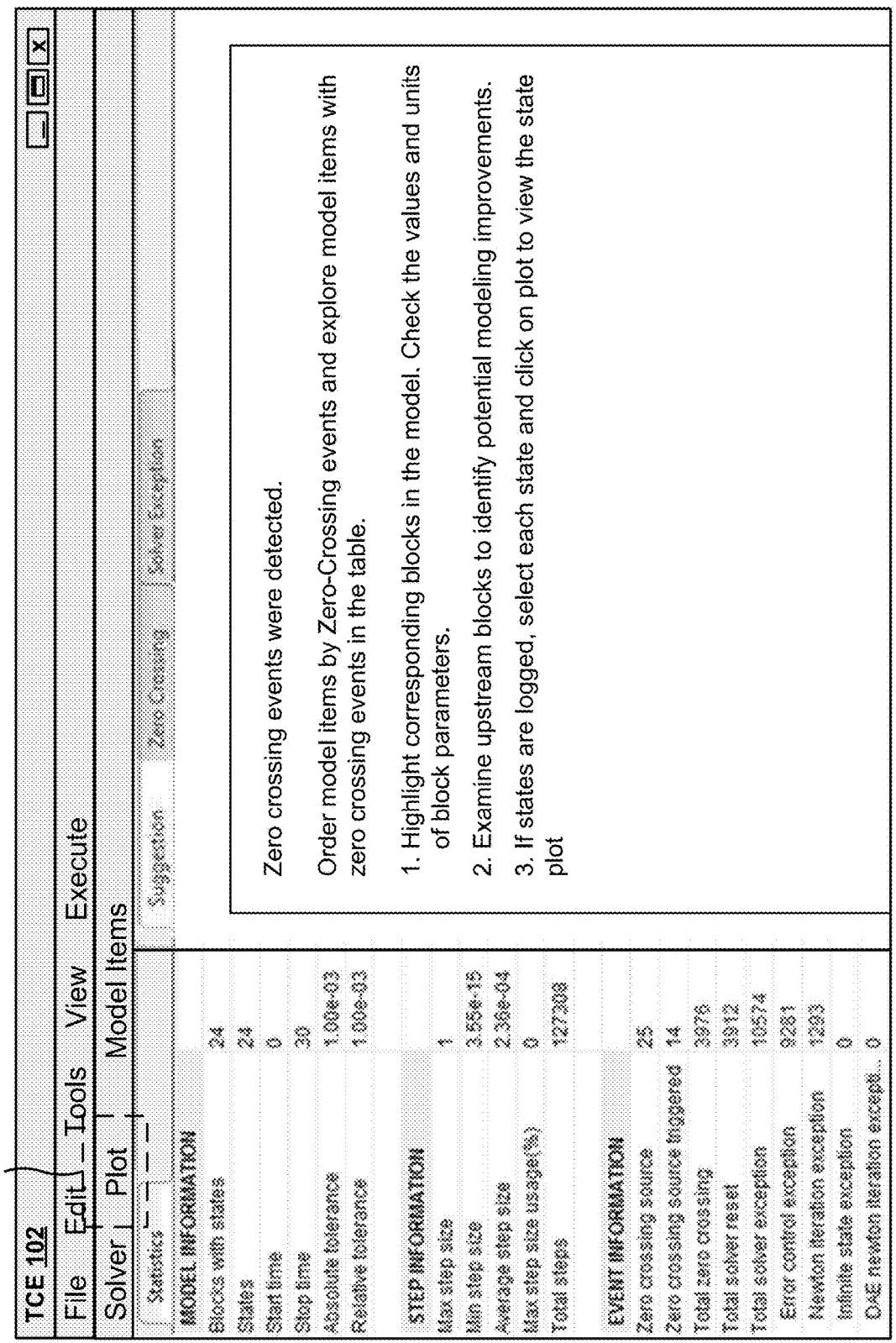

As shown in FIG. 1E, based on the user interaction with the "Suggestion" tab, the graphical interface may provide multiple suggestions for display. For example, TCE 102 may detect one or more conditions based on the data associated with executing the model, and may generate suggestions based on the conditions. In this way, TCE 102 may provide multiple suggestions for display based on detected conditions, which may enable a user to identify where the model needs to be debugged, where the model needs to be modified, potential improvements, potential courses of action, or the like.

In some implementations, TCE 102 may determine one or more suggestions based on the data associated with executing the model. For example, TCE 102 may detect one or more conditions, and may generate one or more suggestions based on the one or more conditions. In some implementations, a condition may include an existence of a DAE Newton iteration failure. Additionally, or alternatively, a condition may include a coupling between a continuous rate and a discrete rate. Additionally, or alternatively, a condition may include a ratio of a quantity of events (e.g., zero crossing events, solver reset events, solver exception events, or the like) to a quantity of steps satisfying a threshold. Additionally, or alternatively, a condition may include a maximum step size utilization value satisfying a threshold. Additionally, or alternatively, a condition may include a value associated with a model item (e.g., a state value and/or a derivative value) satisfying a threshold (e.g., a state value and/or a derivative value). In some implementations, the one or more suggestions may be indicative of advice as to how to mitigate and/or rectify the one or more conditions.

In some implementations, if the simulation and/or TCE 102 is associated with an error (e.g., a freeze, a hang, a stall, or the like), then TCE 102 may detect one or more conditions associated with the error and may determine one or more suggestions based on the conditions. For example, a condition may include a ratio of events to steps satisfying a threshold, at a time point or episode associated with the error. Additionally, or alternatively, a condition may include a value associated with a model item, satisfying a threshold at a time point associated with the error. Additionally, or alternatively, a condition may be user specified (e.g., a user may input information and/or program code that identifies a condition).

In some implementations, TCE 102 may provide an indicator, in association with a suggestion, that identifies an importance of the suggestion, a severity of a problem associated with the suggestion, or the like. For example, TCE 102 may provide a first type of suggestion using a particular indicator (e.g., a green color that may indicate a particular severity level). Additionally, TCE 102 may provide a second type of suggestion using another indicator (e.g., a red color that indicates a more severe severity level). As further shown in FIG. 1E, and by reference number 112, assume that a user interacts with TCE 102 and selects a "Plot" menu item.

Figure 1F:
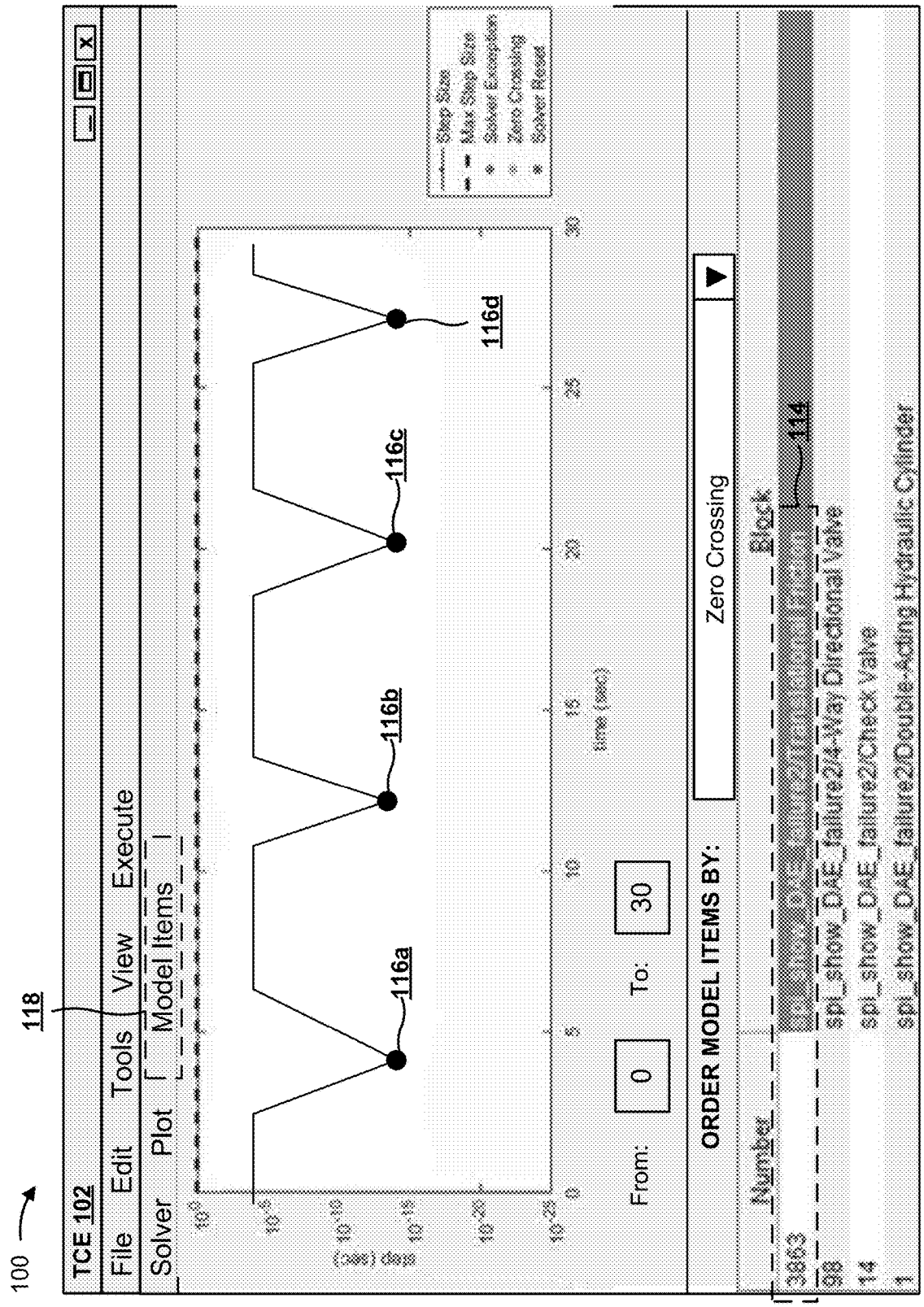

As shown in FIG. 1F, based on the user interaction of the "Plot" menu item, the graphical interface may present a list of ordered model items (e.g., states ordered based on zero crossing events). As shown by reference number 114, assume that a user interacts with the list of ordered states and selects the block "spi_show_DAE_failure2.Translational_Friction." As shown by reference numbers 116a-116d, the plot may include indicators that identify events (e.g., zero crossing events) in association with a step size.

In some implementations, the graphical interface may include a plot that identifies data associated with executing the model. For example, the graphical interface may include a plot that indicates a step size versus time (e.g., a step size signal). In some implementations, the plot may include one or more indicators (e.g., icons, etc.), that correspond to events, in association with the step size (e.g., overlaid in association with the step size signal). In some implementations, TCE 102 may generate various plots (e.g., including step size traces, derivative value traces, etc.) based on executing the model. Additionally, or alternatively, TCE 102 may overlay particular indicators, that correspond to events, in association with a trace of the plot. In this way, a user may determine where, on a simulation trace, a particular event (or events) occurs. Additionally, or alternatively, a user may interact with a list of model items (e.g., blocks, states, etc.), and TCE 102 may provide, for display, overlaid indicators associated with a selected model item.

In some implementations, TCE 102 may provide, for display, information associated with a selected indicator (e.g., based on a user selection of a particular indicator). For example, TCE 102 may provide, for display, information that identifies an event associated with the indicator (e.g., a zero crossing event, a solver reset, or the like), a time associated with the indicator (e.g., a time at which the event occurred), a model item associated with the indicator (e.g., a particular block, a particular state, or the like). In this way, a user may ascertain particular information associated with an event that occurred during execution of the model.

In some implementations, TCE 102 may provide, for display, a particular portion of a model based on a selected indicator. For example, TCE 102 may navigate to a particular portion of the model that includes a model item associated with the event. Additionally, or alternatively, TCE 102 may navigate to a particular model item that is included in a list of model items based on a selected indicator.

In some implementations, a user may interact with the list of ordered model items, and may select another model item. In this case, the plot may include events associated with the selected model item (e.g., may update one or more indicators). Additionally, or alternatively, a user may interact with the input mechanism, and may select another factor, or factors, on which to determine the presentation order of the model items. For example, assume that a user selects another factor (e.g., "solver reset" events) from the drop-down menu. In this case, TCE 102 may determine a presentation order of model items based on the selected factor, and may provide a list of ordered model items for display. Additionally, a user may interact with a particular model item, of the list of ordered model items, and the plot may provide one or more events associated with the selected model item in association with the step size.

In some implementations, TCE 102 may receive information that identifies a time frame, and may determine a presentation order of model items and/or may update a plot based on the information that identifies the time frame. For example, as shown, the graphical interface may display a plot that identifies a step size for a particular time frame (e.g., 30 seconds). As an example, a user may interact with the graphical interface, and may select another time frame (e.g., 10 seconds, 20 seconds, 40 seconds, etc.). In this case, TCE 102 may determine a presentation order of model items based on the selected time frame, and may update the list of ordered model items based on the selected time frame.

Additionally, or alternatively, a user may interact with the plot to specify a particular time frame. For example, TCE 102 may receive information that identifies a time frame based on a user performing an action (e.g., a zoom, a pan, a scroll, a swipe, etc.) in association with the plot and/or modifying a value associated with an axis (e.g., a time axis). As an example, assume that a user performs a zoom action, such that a time frame that ranges from 0 seconds to 15 seconds is displayed. In this case, TCE 102 may determine a presentation order of model items based on the time frame (e.g., 0-15 seconds), and may provide an updated list of ordered model items for display.

Additionally, or alternatively, a user may interact with the plot to specify a particular trace, and TCE 102 may determine a presentation order of model items based on the particular trace. In some implementations, a trace may include a set of values associated with a model item for a particular time frame. Assume that the plot includes multiple traces that may include different values. As an example, assume that a user interacts with the plot to select a particular trace. In this case, TCE 102 may determine a presentation order of model items based on the selected trace. For example, TCE 102 may identify model items that are associated with the selected trace, and may determine a presentation order based on the identified model items that are associated with the selected trace.

In some implementations, TCE 102 may provide a plot and/or a list of ordered model items for display at run time. For example, the plot may progress and/or the list of ordered model items may update (e.g., values associated with the model items may update, the presentation order of model items may change, etc.) as the model executes. In this way, a user may view the plot and/or list of ordered model items as the model executes, and may determine if the simulation is performing as expected (e.g., is operating without error, is operating efficiently, etc.). While implementations described herein may depict data associated with executing the model (e.g., step size information, event information, etc.) being provided in the form of a plot, the data may be displayed using another graphical representation (e.g., a chart, a diagram, a table, or the like). Additionally, while implementations described herein may depict ordered model items being provided in a list, the ordered model items may be displayed using another graphical representation. As further shown in FIG. 1F, and by reference number 118, assume that a user interacts with a "Model Items" menu item.

As shown in FIG. 1G, based on the user interaction with the "Model Items" menu item, the graphical interface may provide an input mechanism that enables a user to select a factor to be used to determine the presentation order of the model items. As shown by reference number 120, assume that a user selects the factor "state derivative" using the input mechanism. Additionally, as shown, TCE 102 may provide another input mechanism that enables the user to specify a particular time frame for which TCE 102 is to determine the presentation order of model items (e.g., using data that pertains to the time frame). As shown, assume that the time frame includes the range of zero seconds to thirty seconds.

Figure 1H:
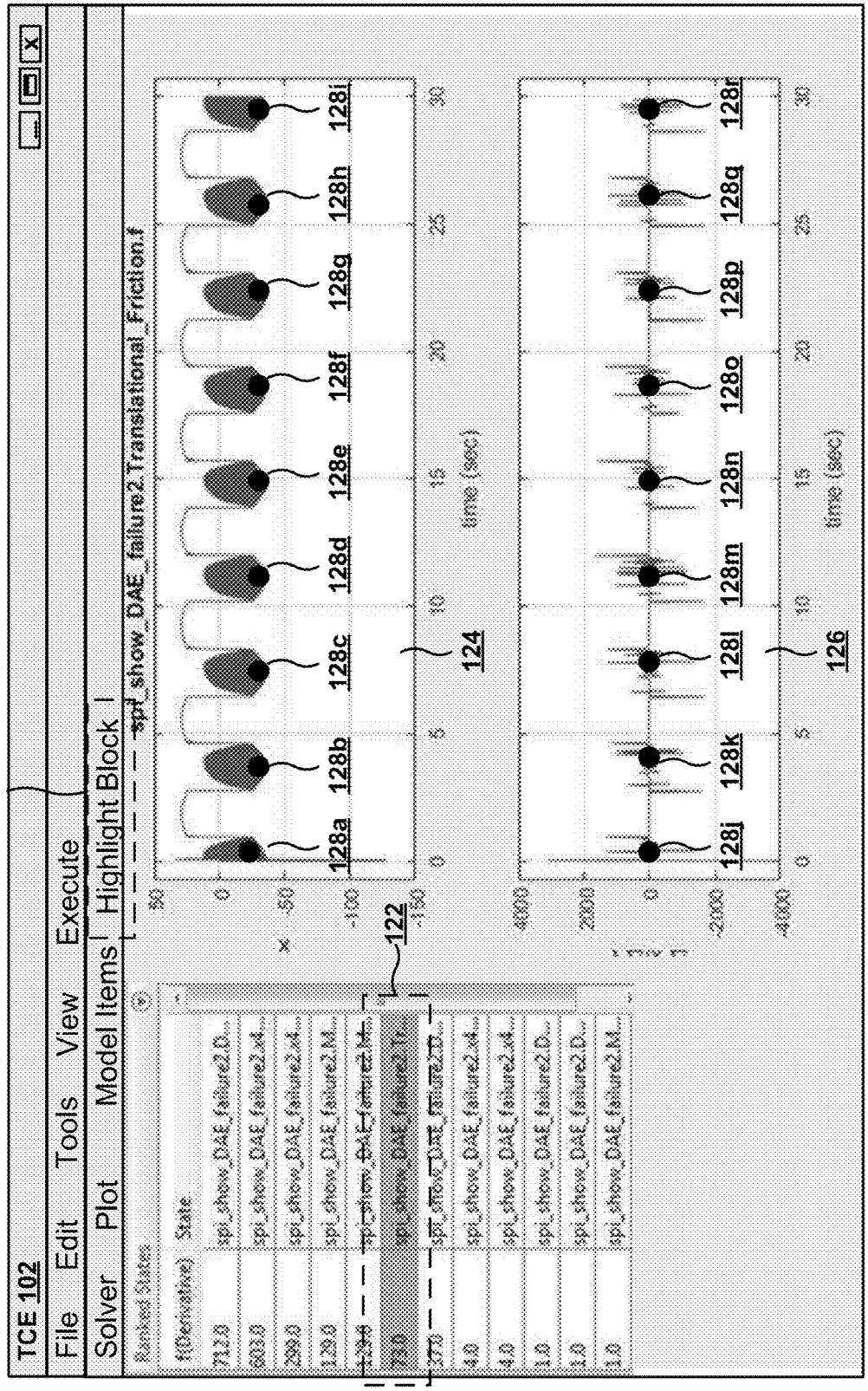

As shown in FIG. 1H, the graphical interface may provide a list of ordered model items (e.g., states ordered based on state derivative values). As shown by reference number 122, assume that a user selects the particular state "spi_show_DAE_failure2.Translational_Friction.f." As shown by reference number 124, the graphical interface may include a first plot that may indicate a value associated with a state versus time. Additionally, as shown by reference number 126, the graphical interface may include a second plot that may indicate a derivative value associated with a state versus time. For example, both the first plot and the second plot may pertain to the selected state. In some implementations, and as shown by reference numbers 128*a*-128*r*, the first plot and/or the second plot may include a set of overlaid indicators, as similar as described above in connection with FIG. 1H. In this way, a user may identify particular values associated with a state, and may determine whether the simulation is associated with an error (e.g., the values are not accurate, the values are not within an expected range, the values are fluctuating unexpectedly, etc.). As further shown in FIG. 1H, and by reference number 130, assume that the user interacts with TCE 102 and selects a "Highlight Block" menu item.

Figure 1I:
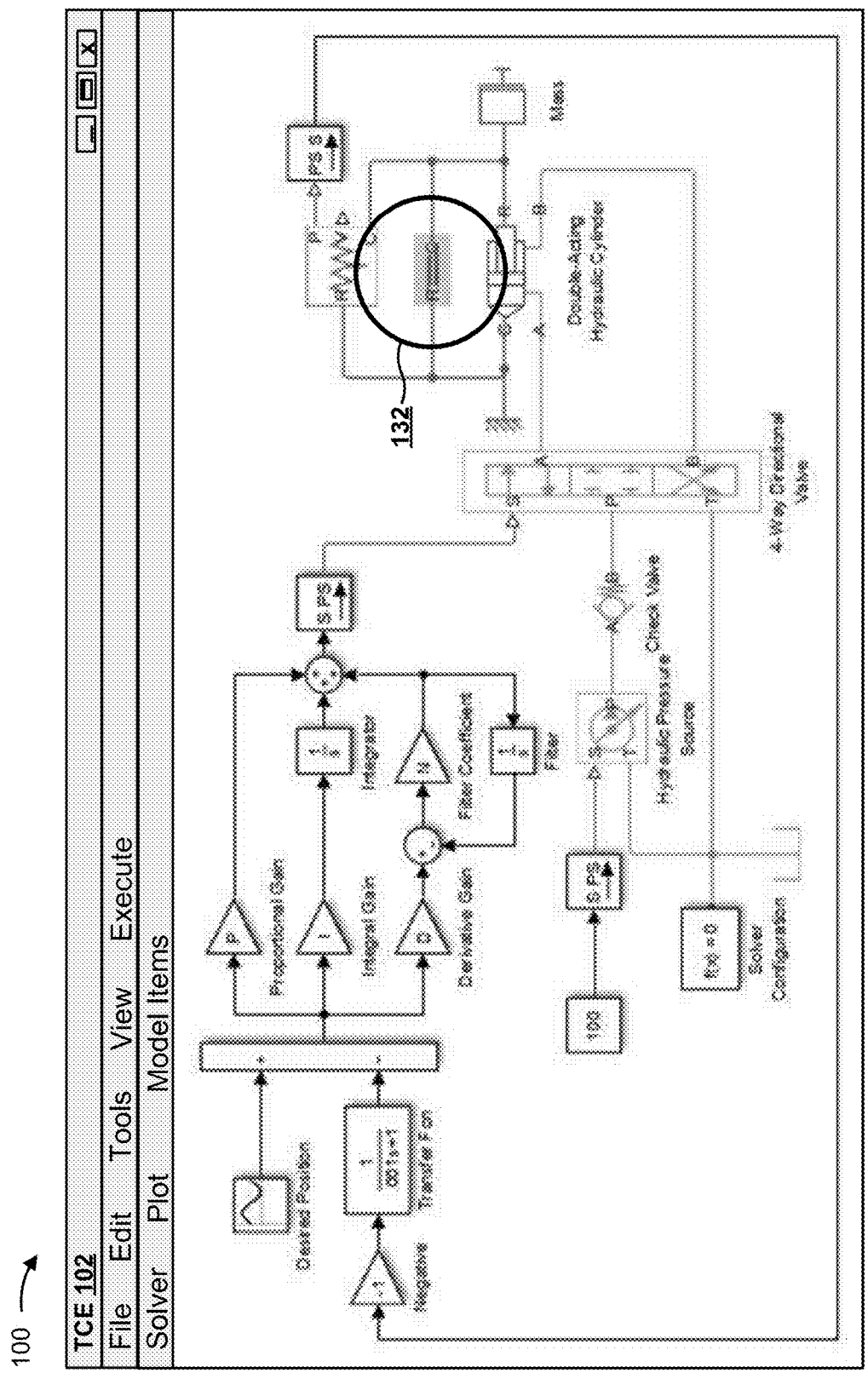

As shown in FIG. 1I, and by reference number 132, TCE 102 may display the model, and may provide an indicator in association with a particular block (e.g., a translational friction block). For example, TCE 102 may display the model and the particular block based on receiving the user input that selected a state associated with the block. Additionally, or alternatively, TCE 102 may provide an indicator in association with the block (e.g., may highlight the block, may shade the block a particular color, may provide text in association with the block, or the like). Additionally, or alternatively, TCE 102 may display information associated with the block (e.g., a quantity of states associated with the block, values associated with the states, a quantity of events associated with the block, or the like). Additionally, or alternatively, TCE 102 may display other blocks that may affect the particular block and/or that may be affected by the particular block (e.g., upstream blocks, downstream blocks, etc.).

In some implementations, the graphical interface may be in the form of an overlay (e.g., where TCE 102 generates the graphical interface to include the model). Additionally, or alternatively, TCE 102 may superimpose the graphical interface over the model. Additionally, or alternatively, the graphical interface may be in the form of another type of display (e.g., a tree diagram, a hierarchy diagram, etc.).

In some implementations, TCE 102 may superimpose data associated with executing the model over a particular block (e.g., a block associated with the data). For example, TCE 102 may superimpose data, such as a quantity of events, values, etc., over a block while the model executes and/or based on the data associated with executing the model. Additionally, or alternatively, TCE 102 may display data associated with a block based on a user interaction with the block (e.g., a click, a hover, or the like). Additionally, or alternatively, TCE 102 may provide an indicator in association with a particular block while the model executes and/or based on the data associated with executing the model. For example, assume that a block is associated with a particular value that satisfies a threshold and/or is associated with a quantity of events that satisfies a threshold. In this case, TCE 102 may provide a warning indicator (e.g., an exclamation point) in association with the block, may shade the block a particular color (e.g., red), or the like.

In some implementations, TCE 102 may navigate to a particular block based on a user input. For example, TCE 102 may receive information that identifies a user interaction associated with a particular state (e.g., in association with a list of ordered states), and may navigate to a particular block (or group of blocks) that is associated with the selected state (e.g., may display a portion of the model associated with the block).

In some implementations, TCE 102 may receive information that identifies a user interaction with a trace (e.g., a step size trace, a state value trace, a state derivative value trace, etc. associated with an execution of the model). For example, assume that the trace includes a set of overlaid indicators (e.g., corresponding to events), and that a user interacts with a particular indicator. In this case, TCE 102 may navigate to a particular block (or a set of blocks) associated with the indicator. Additionally, or alternatively, TCE 102 may provide, for display, information that identifies the block (e.g., in association with a list of ordered blocks).

Additionally, or alternatively, TCE 102 may provide an indicator associated with the block (e.g., may highlight the block, may display particular information associated with the block, or the like). In some cases, a model may include multiple systems, sub-systems, etc., and may include a large quantity of blocks. In this way, TCE 102 may enable a user to quickly identify a block that may be causing the simulation to perform in a non-optimal manner.

While implementations herein describe determining a presentation order of model items associated with a block diagram model, other implementations include determining presentation orders of model items associated with other types of models (e.g., textual models, models of physical structures, models of physiological systems, or the like). In other words, implementations described herein are applicable to any set of equations that may be solved (e.g., to model a particular system, or the like).

For example, assume that the model includes a model of a physical structure such as a building, a bridge, etc. In this case, one or more equations and/or variables (e.g., model items) of the model may represent a physical event and/or measurable phenomena associated with the structure (e.g., a stress, a deformation, a load, or the like, associated with a particular portion of the structure, such as a truss, a load bearing object, or the like). Additionally, in this case, a computing device may determine a presentation order of model items, and provide information for display that identifies the ordered model items. In this way, a user of the computing device may identify particular portions of the structure that are associated with potential issues.

In other cases, the model may include a set of equations, and a computing device may determine a presentation order of the set of equations, variables of the set of equations, etc. based on implementing techniques described herein.

Implementations described herein enable a computing device to execute a model, collect data associated with executing the model, process the data to determine events associated with particular model items, determine a presentation order of the model items based on the events, and provide information for display that identifies the model items in the presentation order and/or identifies a portion of the model associated with the model item. In this way, implementations described herein enable a user to determine where a model needs to be debugged, where the model is to be modified to increase execution speed, particular blocks and/or states that are negatively affecting a simulation, or the like. In this way, implementations described herein may enable a user to identify particular errors and/or issues associated with the execution of a model, may provide information that identifies a part of the model that is associated with an error, and/or may provide information that identifies particular suggestions as to how to rectify the error. In this way, implementations described herein may enable a user to adjust a model such that a quantity of errors associated with executing graphical models and/or a quantity of computing resources required to debug a model are reduced, thereby conserving computing resources, such as processing power, memory, or the like, and reducing programming time.

As indicated above, FIGS. 1A-1I are provided as examples. Other examples are possible and may differ from what was described with regard to FIGS. 1A-1I.

Figure 2:
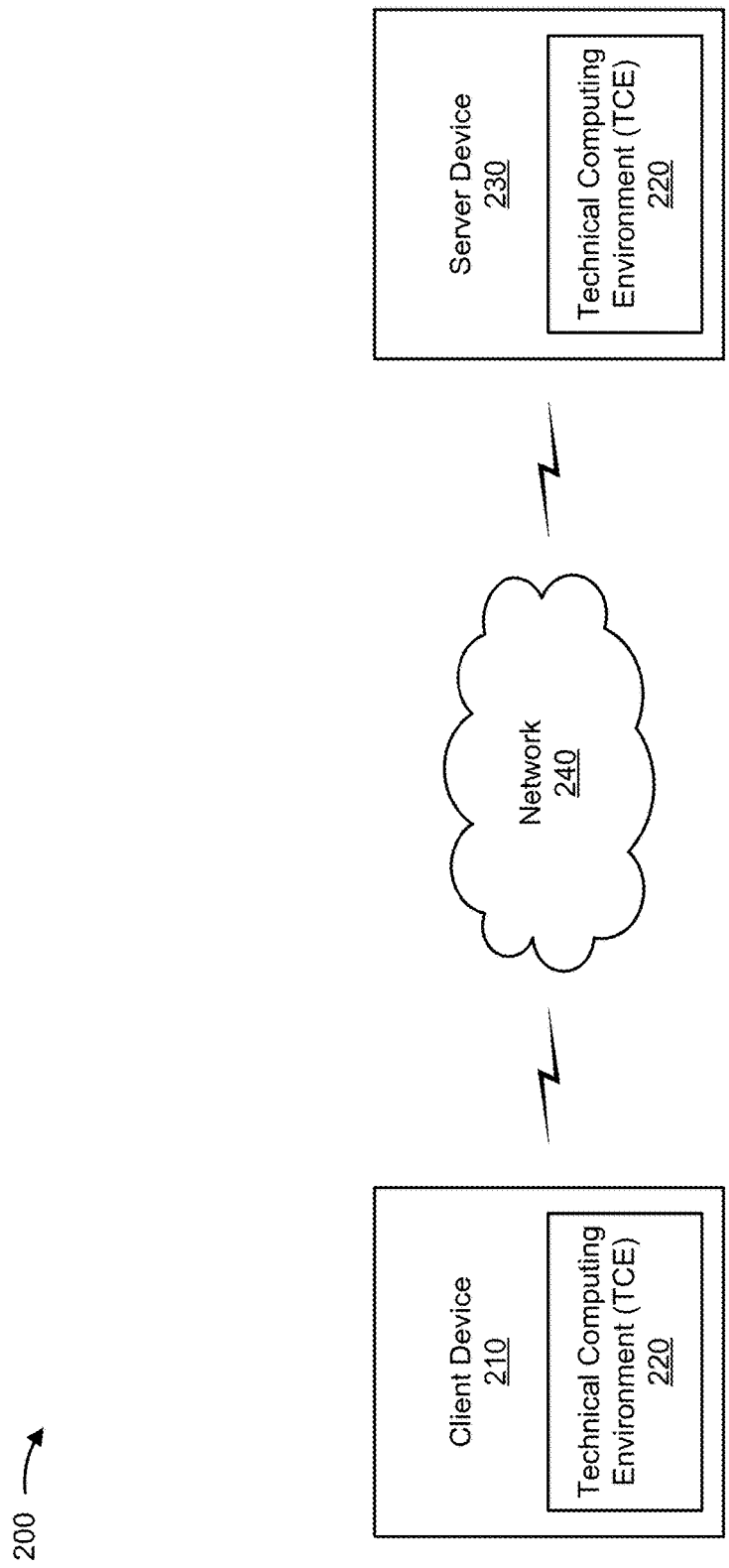
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a client device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

Client device 210 may include one or more devices capable of receiving, generating, storing, processing, and/or providing information associated with a graphical model. For example, client device 210 may include a computing device, such as a desktop computer, a laptop computer, a tablet computer, a mobile phone (e.g., a smart phone, a radiotelephone, etc.), or a similar device. In some implementations, client device 210 may receive information from and/or transmit information to server device 230 (e.g., information associated with a model).

Client device 210 may host TCE 220. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software by The MathWorks, Inc.), a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dassault Systemes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; ANSYS CFD, Mechanical Enterprise, and/or another Finite Element Analysis, Computational Fluid Dynamics, and/or Computer Aided Engineering (e.g., where the model may include geometry of structures and states may be associated with elements in a structure), etc. tool from ANSYS, Inc., etc.), or another type of environment, such as a hybrid environment that may include, for example, a text-based environment and a graphically-based environment.

TCE 220 may include a graphical modeling environment. In some implementations, a graphical modeling environment may include a block diagram environment for modeling, simulating, and/or executing a system using a block diagram, for automatically generating code for simulating the system, for testing or verifying the system, or the like. Additionally, or alternatively, a graphical modeling environment may include a state machine environment for modeling, simulating, and/or executing decision logic using a state machine, a flow chart, or the like. The graphical modeling environment may be associated with one or more elements (e.g., entities, such as graphical entities, textual entities, programming objects; relationships between entities; ports associated with entities; attributes of entities; etc.), as described in more detail elsewhere herein. In some implementations, the elements may be executable.

For example, TCE 220 may include a modeling environment that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, discrete events, discrete states, etc.). Execution of a model to simulate a system may also be referred to as simulating a model. The model may further include static relations (e.g., algebraic relations, stochastic relations, inequalities, etc.).

The system represented by a model may have various execution semantics that may be represented in the model as a collection of modeling entities, sometimes referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice.

A block may be hierarchical in that the block itself may include one or more blocks that make up the block. A block including one or more blocks (sub-blocks) may be referred to as a subsystem block. A subsystem block may be configured to represent a subsystem of the overall system represented by the model. A subsystem block may be a masked subsystem block that is configured to have a logical workspace that contains variables only readable and writeable by elements contained by the subsystem block.

A graphical model (e.g., a functional model) may include entities with relationships between the entities, and the relationships and/or the entities may have attributes associated with them. The entities may include, for example, blocks and/or ports. The relationships may include for example, lines (e.g., connector lines) and/or references (e.g., textual labels). The attributes may include, for example, value information and meta information for the model element associated with the attributes. A graphical model may be associated with configuration information. The configuration information may include information for the graphical model, such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

In some implementations, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, a non-causal port, an enable port, a trigger port, a function-call port, a publish port, a subscribe port, an exception port, an error port, a physics port, a power port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may include determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic cycles or loops. Assigning causality may be part of model compilation.

Equations may be provided in symbolic form. A set of symbolic equations may be symbolically processed to, for example, produce a simpler form. To illustrate, a system of two equations X=2Y+U and Y=3X−2U may be symbolically processed into one equation 5Y=−U. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally specific or consistent signal flow between blocks, in other implementations, the interactions between blocks may not necessarily be directionally specific or consistent.

In some implementations, connector lines in a model may represent related variables that are shared between two connected blocks. The variables may be related such that their combination may represent power. For example, connector lines may represent voltage, current, power, etc. In some implementations, the signal flow between blocks may be automatically derived.

In some implementations, one or more blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ODEs, partial differential equations (PDEs), and/or DAEs. Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

In some implementations, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

In some implementations, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristic settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

In some implementations, the graphical modeling environment may include one or more models. When the graphical modeling environment includes multiple models, the multiple models may be related. For example, a particular model may be a child model (e.g., a sub-model) of a parent model, or may be a parent model of a child model. Additionally, or alternatively, a particular model may reference another model. In some implementations, a model may be stored locally by client device 210. In some implementations, a model may be stored remotely by client device 210, such as by server device 230 (e.g., in a cloud computing environment).

Server device 230 may include one or more devices capable of receiving, generating, storing, processing, and/or providing information associated with a graphical model. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute program code (e.g., serially or in parallel), and may provide respective results of executing the program code to client device 210.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., program code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
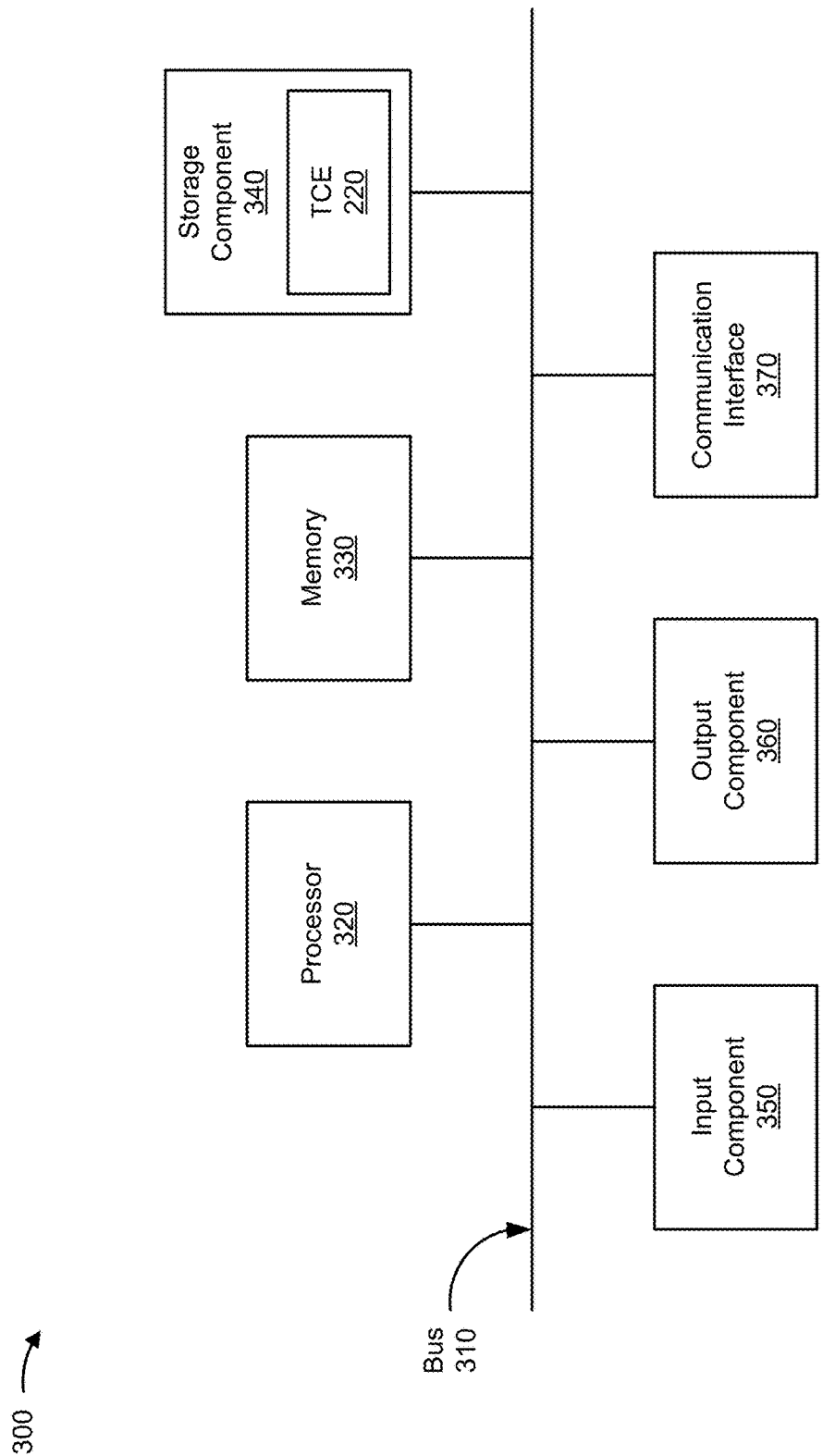
FIG. 3 is a diagram of example components of one or more devices of FIG. 2.

FIG. 3 is a diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 includes a processor (e.g., a central processing unit (CPU), a graphics processing unit (GPU), and/or an accelerated processing unit (APU)), a microprocessor, a microcontroller, and/or any processing component (e.g., a field-programmable gate array (FPGA) and/or an application-specific integrated circuit (ASIC)) that interprets and/or executes instructions. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
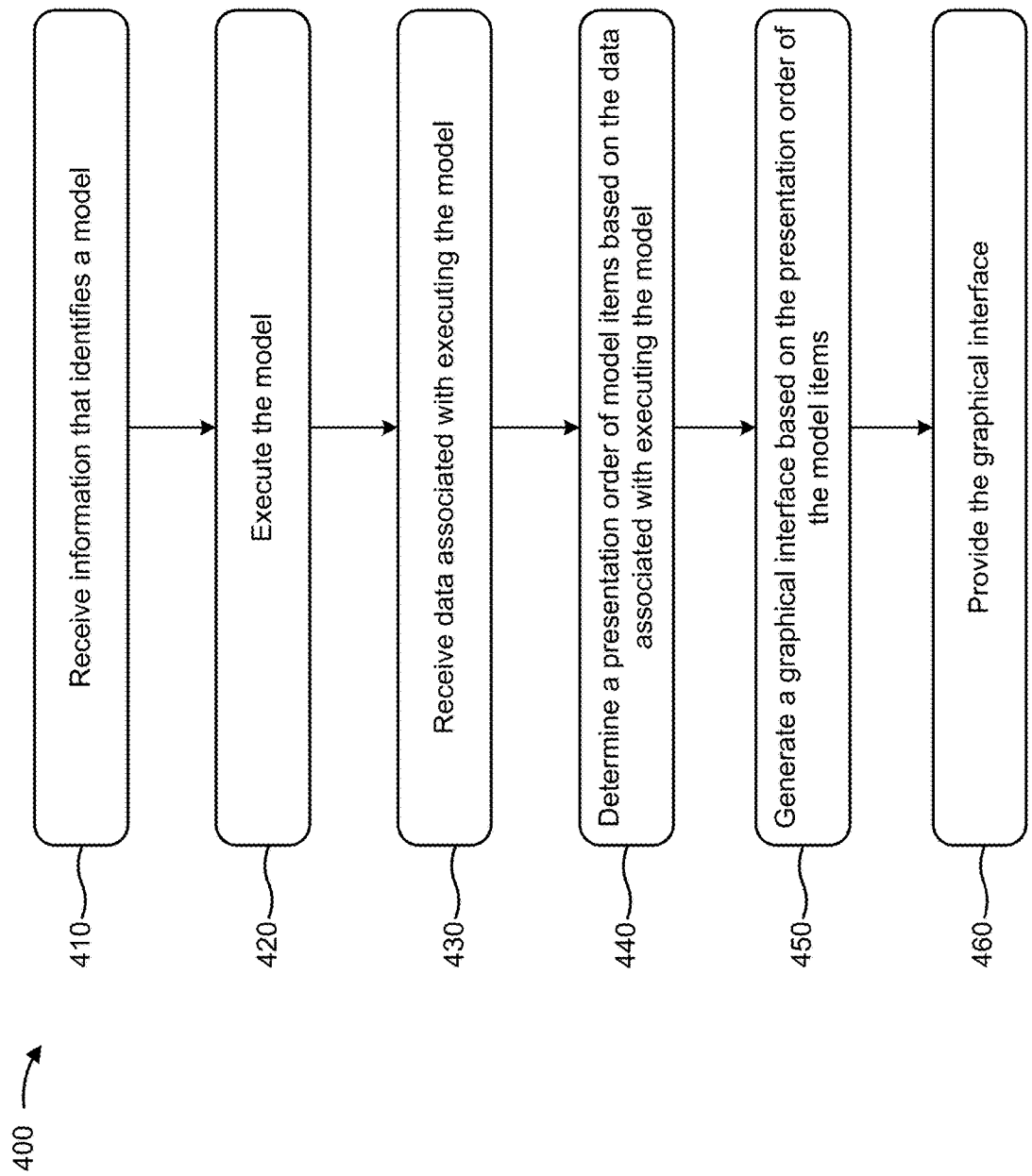
FIG. 4 is a diagram of an example implementation of providing a graphical representation of ordered model items based on solver information.

FIG. 4 is a flow chart of an example process 400 for providing a graphical representation of ordered model items based on solver information. In some implementations, one or more process blocks of FIG. 4 may be performed by client device 210. In some implementations, one or more process blocks of FIG. 4 may be performed by another device or a group of devices separate from or including client device 210, such as server device 230.

As shown in FIG. 4, process 400 may include receiving information that identifies a model (block 410), executing the model (block 420), and receiving data associated with executing the model (block 430). For example, client device 210 may receive information that identifies a model, may execute the model, and may receive data associated with executing the model. In some implementations, client device 210 may receive data that identifies a quantity of events associated with model items. For example, an event may include a zero crossing, a solver reset, an error control exception, a Newton iteration exception, a DAE Newton iteration exception, an infinite state exception, or the like. Additionally, or alternatively, client device 210 may receive information that identifies step sizes associated with a solver. Additionally, or alternatively, client device 210 may receive information associated with a solver used during execution of the model. Additional details regarding receiving information that identifies a model, executing the model, and receiving data associated with executing the model are described above in connection with FIGS. 1A-1I.

As further shown in FIG. 4, process 400 may include determining a presentation order of model items based on the data associated with executing the model (block 440). For example, client device 210 may determine a presentation order of model items based on the data associated with executing the model. In some implementations, the model items may be associated with the model, and the solver may be used to determine values associated with the model items. In some implementations, client device 210 may determine a presentation order of model items based on a quantity of events associated with the model items. In some implementations, the events may be associated with a solver. Additionally, or alternatively, client device 210 may receive information that identifies a time frame, and may determine a presentation order of model items based on the time frame.

In some implementations, the model items may be associated with multiple factors. Additionally, the multiple factors may be associated with values associated with the model items. Additionally, client device 210 may determine the presentation order of model items based on the multiple factors. Additionally, or alternatively, client device 210 may receive information that identifies a factor, and may determine the presentation order of model items based on the information that identifies the factor. Additionally, or alternatively, client device 210 may receive information that identifies another factor, and may determine another presentation order of model items based on the information that identifies the other factor.

In some implementations, client device 210 may receive information that identifies a time frame and may determine a presentation order of model items based on the time frame. For example, client device 210 may execute the model beyond the time frame, however, may not determine the presentation order of model items using data collected beyond the time frame. Additionally, or alternatively, client device 210 may receive information that identifies a portion of the model, and may determine the presentation order of the model items based on the portion of the model. Additional details regarding determining a presentation order of model items based on the data associated with executing the model are described above in connection with FIGS. 1A-1I.

As further shown in FIG. 4, process 400 may include generating a graphical interface based on the presentation order of the model items (block 450), and providing the graphical interface (block 460). For example, client device 210 may generate a graphical interface based on the presentation order of the model items and may provide the graphical interface for display. Additionally, the graphical interface may provide information that identifies the plurality of model items in association with the presentation order. In some implementations, client device 210 may receive information that identifies a selection of a model item, and may provide information that identifies a portion of the model and/or identifies a block for display. Additionally, or alternatively, client device 210 may generate a plot that identifies a step size or step sizes, associated with a solver, and multiple events associated with the model items. The plot may, for example, identify the multiple events in association with the step size or step sizes.

Additionally, or alternatively, client device 210 may receive information that identifies a selection of a model item, and may generate a plot that identifies values associated with the model item. In some implementations, client device 210 may detect a condition, and may determine a suggestion based on the condition. Additionally, client device 210 may provide the suggestion for display.

In some implementations, client device 210 may receive information that identifies values associated with a model item, and may receive information that identifies events associated with the model item. Additionally, or alternatively, client device 210 may generate a plot that identifies the values in association with the events, and may provide the plot for display. Additional details regarding generating a graphical interface based on the presentation order of the model items, and providing the graphical interface are described above in connection with FIGS. 1A-1I.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Implementations described herein assist in the debugging of graphical models by providing information for display that identifies a presentation order of model items. Additionally, implementations described herein reduce a quantity of errors associated with simulating graphical models and/or conserve computing resources required to debug a graphical model, thereby conserving computing resources, such as processing power, memory, or the like. Additionally, implementations described herein improve productivity and conserve processor and/or memory resources by reducing a user's development time.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Code (sometimes referred to herein as program code) is to be broadly interpreted to include C++ code, Hardware Description Language (HDL) code, very-high-speed integrated circuits (VHSIC) HDL (VHDL) code, Verilog code, Java code, binary code that may be executed (e.g., executable files that may be directly executed by an operating system, bitstream files that may be used to configure an FPGA, Java byte code, object files combined together with linker directives, source code, makefiles, or the like), text files that may be executed in conjunction with other executables (e.g., Python text files, Octave files, a collection of dynamic-link library (DLL) files with text-based combining, configuration information that connects pre-compiled modules, an extensible markup language (XML) file describing module linkage, or the like), source code (e.g., readable by a human), machine code (e.g., readable by a machine), code generated using a dynamically-typed programming language (e.g., the M language, a MATLAB® language, a MATLAB-compatible language, a MATLAB-like language, or the like), or the like.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
executing a model,
the executing being performed by one or more devices;
receiving data associated with the executing the model,
the data being associated with a solver used during execution of the model, the receiving being performed by the one or more devices;

determining a presentation order ranking a plurality of model items based on the data associated with the executing the model,
the plurality of model items being associated with the model,
the solver being used to determine values associated with the plurality of model items,
the plurality of model items being associated with one or more factors,
the one or more factors being associated with the values,
the presentation order ranking the plurality of model items being determined based on the one or more factors, and
the determining being performed by the one or more devices;
generating a graphical interface that indicates the presentation order ranking the plurality of model items,
the generating being performed by the one or more devices; and
providing the graphical interface,
the graphical interface to provide information that associates the plurality of model items with the presentation order,
the providing being performed by the one or more devices.

2. The method of claim 1, further comprising:
receiving information that identifies a selection of a model item of the plurality of model items in association with the graphical interface; and
providing information, in association with another graphical interface associated with the model, that identifies a portion of the model based on the selection of the model item,
the portion of the model being associated with the model item.

3. The method of claim 1, where the data associated with the executing the model identifies a quantity of events associated with the plurality of model items,
the events being associated with the solver; and
where the determining the presentation order ranking the plurality of model items comprises:
determining the presentation order ranking the plurality of model items based on the quantity of events.

4. The method of claim 1, further comprising:
receiving information that identifies a time frame; and
where the determining the presentation order ranking the plurality of model items comprises:
determining the presentation order ranking the plurality of model items based on the time frame.

5. The method of claim 1, further comprising:
determining a range in values of a model item of the plurality of model items; and
where the determining the presentation order ranking the plurality of model items comprises:
determining the presentation order ranking the plurality of model items based on the range in values of the model item.

6. The method of claim 1, further comprising:
receiving information that identifies a type of model item; and
where the generating the graphical interface that indicates the presentation ranking the plurality of model items comprises:
generating the graphical interface that indicates the presentation order ranking the plurality of model items based on the information that identifies the type of model item,
the plurality of model items being associated with the type of model item.

7. The method of claim 1, further comprising:
receiving information that identifies a factor of the one or more factors;
determining another presentation order ranking the plurality of model items based on the factor; and
where the generating the graphical interface comprises:
generating the graphical interface to indicate the other presentation order ranking the plurality of model items.

8. A non-transitory computer-readable medium storing instructions, the instructions comprising:
one or more instructions that, when executed by one or more processors, cause the one or more processors to:
receive data associated with executing a model,
the data being associated with a solver used during execution of the model;
determine a presentation order ranking a plurality of model items based on the data associated with executing the model,
the plurality of model items being associated with the model,
the presentation order ranking the plurality of model items being determined based on a plurality of events associated with the solver,
the events being associated with values of the plurality of model items;
generate a graphical interface to indicate the presentation order ranking the plurality of model items; and
provide the graphical interface for display.

9. The non-transitory computer-readable medium of claim 8, where the plurality of model items are a first type of model item,
the first type including blocks; and
where the one or more instructions, when executed by the one or more processors, further cause the one or more processors to:
determine the presentation order ranking the plurality of model items based on values associated with a second type of model item,
the second type including states.

10. The non-transitory computer-readable medium of claim 8, where the one or more instructions, when executed by the one or more processors, further cause the one or more processors to:
receive information that identifies a user selection, in association with the graphical interface, of a model item of the plurality of model items; and
provide information, in association with another graphical interface that is displaying the model, that identifies a portion of the model, associated with the model item, based on the user selection.

11. The non-transitory computer-readable medium of claim 8, where an event, of the plurality of events, includes at least one of:
a zero crossing;
a solver reset;
an error control exception;
a Newton iteration exception;
a differential algebraic equation Newton iteration exception; or
an infinite state exception.

12. The non-transitory computer-readable medium of claim 8, where the one or more instructions, when executed by the one or more processors, further cause the one or more processors to:

receive information that identifies a time frame; and
where the one or more instructions, that cause the one or more processors to determine the presentation order ranking the plurality of model items, cause the one or more processors to:
   determine the presentation order ranking the plurality of model items based on the time frame,
      the model executing beyond the time frame, and
      the presentation order ranking the plurality of model items not being determined based on data associated with executing the model beyond the time frame.

13. The non-transitory computer-readable medium of claim 8, where the one or more instructions, when executed by the one or more processors, further cause the one or more processors to:
receive information that identifies a selection of a portion of the model; and
where the one or more instructions, that cause the one or more processors to determine the presentation order ranking the plurality of model items, cause the one or more processors to:
   determine the presentation order ranking the plurality of model items based on the information that identifies the selection of the portion of the model,
      the plurality of model items being associated with the portion of the model.

14. The non-transitory computer-readable medium of claim 8, where the one or more instructions, when executed by the one or more processors, further cause the one or more processors to:
detect one or more conditions based on the data associated with executing the model;
determine one or more suggestions based on the one or more conditions; and
where the one or more instructions, that cause the one or more processors to provide the graphical interface for display, cause the one or more processors to:
   provide the graphical interface for display to identify the one or more suggestions,
      the one or more suggestions being provided for display, and
      the one or more suggestions being indicative of advice as to how to mitigate the one or more conditions.

15. A device, comprising:
one or more processors to:
receive data associated with executing a model, the data being associated with a solver used during execution of the model;
determine a presentation order ranking a plurality of model items based on the data associated with the executing the model, the presentation order ranking the plurality of model items,
   the presentation order ranking the plurality of model items being determined based on a plurality of factors, and
   the plurality of factors being associated with the values;
generate a graphical interface that indicates the presentation order ranking the plurality of model items; and
provide the graphical interface,
   the graphical interface to provide, for display, a list of the plurality of model items,
   the list being provided in association with the presentation order.

16. The device of claim 15, where the one or more processors are further to:

receive information that identifies a selection of one or more factors of the plurality of factors; and
where the one or more processors, when determining the presentation order ranking the plurality of model items, are to:
   determine the presentation order ranking the plurality of model items based on the information that identifies the selection of the one or more factors.

17. The device of claim 15, where the plurality of model items are blocks; and
where the one or more processors are further to:
determine values associated with other model items,
   the other model items including states; and
where the one or more processors, when determining the presentation order, are to:
   determine the presentation order based on the values associated with the other model items.

18. The device of claim 15, where the one or more processors are further to:
receive information that identifies a selection of a model item of the plurality of model items; and
provide information for display, in association with another graphical interface that is displaying the model, that identifies the model item.

19. The device of claim 15, where the one or more processors are further to:
receive information that identifies one or more factors of the plurality of factors; and
where the one or more processors, when determining the presentation order ranking the plurality of model items, are to:
   determine the presentation order ranking the plurality of model items based on the one or more factors.

20. The device of claim 15, where the one or more processors are further to:
receive information that identifies a plurality of values associated with a model item of the plurality of model items,
   the values associated with the plurality of model items including the plurality of values;
receive information that identifies a plurality of events associated with the model item,
   the plurality of events being associated with the plurality of values and the solver;
generate a plot that identifies the plurality of values and the plurality of events; and
where the one or more processors, when providing the graphical interface, are to:
   provide the graphical interface that includes the plot.

21. The method of claim 1, where the one or more factors include at least one of:
a quantity of zero crossing events,
a quantity of solver resets events,
a quantity of solver exceptions,
a quantity of warnings,
a name of at least one of the plurality of model items,
a user defined factor, or
a location of model item.

22. The method of claim 1, where at least one of the plurality of model items is:
a state,
a block,
a set of blocks,
a variable,
a port,
a signal,
a trace, or
an equation.

23. The method of claim 1, where at least one of the plurality of model items is a state and at least one of the values is:
  a value of the state,
  a derivative value of the state, or
  a range of values associated with the state.

24. A non-transitory computer-readable medium storing instructions, the instructions comprising:
  one or more instructions that, when executed by one or more processors, cause the one or more processors to:
  execute a model;
  receive data associated with the execute the model, the data being associated with a solver used during execution of the model, the solver being used to determine values associated with a plurality of model items of the model;
  determine a presentation order ranking the plurality of model items based on the data associated with the execute the model and on one or more factors, the one or more factors associated with the values determined by the solver,
  generate a graphical interface that indicates the presentation order ranking the plurality of model items; and
  provide the graphical interface, the graphical interface providing information that associates the plurality of model items with the presentation order.

25. The non-transitory computer-readable medium of claim 24, wherein the one or more instructions further cause the one or more processors to:
  receive information that identifies a time frame; and
  where the determine the presentation order ranking the plurality of model items includes:
  determine the presentation order ranking the plurality of model items based on the time frame.

26. The non-transitory computer-readable medium of claim 24, wherein the one or more instructions further cause the one or more processors to:
  determine a range in values of a model item of the plurality of model items; and
  where the determine the presentation order ranking the plurality of model items includes:
  determine the presentation order ranking the plurality of model items based on the range in values of the model item.

27. The non-transitory computer-readable medium of claim 24, where the one or more factors include at least one of:
  a quantity of zero crossing events,
  a quantity of solver reset events,
  a quantity of solver exceptions,
  a quantity of warnings,
  a name of at least one of the plurality of model items,
  a user defined factor, or
  a location of a model item.

28. The non-transitory computer-readable medium of claim 24, where at least one of the plurality of model items is:
  a state,
  a block,
  a set of blocks,
  a variable,
  a port,
  a signal,
  a trace, or
  an equation.

29. The non-transitory computer-readable medium of claim 24, where at least one of the plurality of model items is a state and at least one of the values is:
  a value of the state,
  a derivative value of the state, or
  a range of values associated with the state.

30. A device, comprising:
  a memory storing a model; and
  one or more processors coupled to the memory, the one or more processors configured to:
  execute a model;
  receive data associated with the execute the model, the data being associated with a solver used during execution of the model, the solver being used to determine values associated with a plurality of model items of the model;
  determine a presentation order ranking the plurality of model items based on the data associated with the execute the model and on one or more factors, the one or more factors associated with the values determined by the solver,
  generate a graphical interface that indicates the presentation order ranking the plurality of model items, and
  provide the graphical interface, the graphical interface providing information that associates the plurality of model items with the presentation order.

31. The device of claim 30, wherein the one or more processors is further configured to:
  receive information that identifies a time frame; and
  where the determine the presentation order ranking the plurality of model items includes:
  determine the presentation order ranking the plurality of model items based on the time frame.

32. The device of claim 30, wherein the one or more processors is further configured to:
  determine a range in values of a model item of the plurality of model items; and
  where the determine the presentation order ranking the plurality of model items includes:
  determine the presentation order ranking the plurality of model items based on the range in values of the model item.

33. The device of claim 30, where the one or more factors include at least one of:
  a quantity of zero crossing events,
  a quantity of solver reset events,
  a quantity of solver exceptions,
  a quantity of warnings,
  a name of at least one of the plurality of model items,
  a user defined factor, or
  a location of a model item.

34. The device of claim 30, where at least one of the plurality of model items is:
  a state,
  a block,
  a set of blocks,
  a variable,
  a port,
  a signal,
  a trace, or
  an equation.

35. The device of claim 30, where at least one of the plurality of model items is a state and at least one of the values is:
  a value of the state,
  a derivative value of the state, or
  a range of values associated with the state.

* * * * *

UNITED STATES PATENT AND TRADEMARK OFFICE
CERTIFICATE OF CORRECTION

PATENT NO. : 10,969,933 B1
APPLICATION NO. : 15/426607
DATED : April 6, 2021
INVENTOR(S) : Guy Rouleau et al.

Page 1 of 1

It is certified that error appears in the above-identified patent and that said Letters Patent is hereby corrected as shown below:

In the Claims

Column 23, Lines 21-23 Claim 1:
"the graphical interface to provide information that associates the plurality of model items with the presentation order,"
Should be deleted.

Column 26, Line 52 Claim 21:
"a quantity of solver resets events"
Should read:
--a quantity of solver reset events--.

Signed and Sealed this
Twenty-fourth Day of June, 2025

Coke Morgan Stewart
*Acting Director of the United States Patent and Trademark Office*